United States Patent
Jones et al.

(10) Patent No.: US 7,160,822 B2
(45) Date of Patent: Jan. 9, 2007

(54) METHOD OF FORMING QUANTUM DOTS FOR EXTENDED WAVELENGTH OPERATION

(75) Inventors: Timothy S. Jones, Surrey (GB); Patrick Howe, London (GB); Ray Murray, Reading (GB); Eric Le Ru, Wellington (NZ)

(73) Assignee: Imperial College Innovations Limited, London (GB)

( * ) Notice: Subject to any disclaimer, the term of this patent is extended or adjusted under 35 U.S.C. 154(b) by 51 days.

(21) Appl. No.: 10/514,660

(22) PCT Filed: May 19, 2003

(86) PCT No.: PCT/GB03/02152

§ 371 (c)(1),
(2), (4) Date: May 19, 2005

(87) PCT Pub. No.: WO03/100833

PCT Pub. Date: Dec. 4, 2003

(65) Prior Publication Data

US 2005/0227386 A1    Oct. 13, 2005

(30) Foreign Application Priority Data

May 24, 2002   (GB) ................... 0212055.8

(51) Int. Cl.
*H01L 21/00* (2006.01)
(52) U.S. Cl. .............. 438/962; 257/E29.071; 257/E29.168; 257/E49.003
(58) Field of Classification Search ........... 438/962; 257/E29.071, E29.168, E49.003
See application file for complete search history.

(56) References Cited

U.S. PATENT DOCUMENTS 5,888,885 A    3/1999    Xie (Continued)

FOREIGN PATENT DOCUMENTS

EP    0 665 578 A2    8/1995

(Continued)

*Primary Examiner*—Thao P. Le
(74) *Attorney, Agent, or Firm*—Nixon & Vanderhye P.C.

(57) ABSTRACT

A method of forming the active region of an optoelectronic device incorporating semiconductor quantum dots whose ground state emission occurs at wavelengths beyond 1350 nm at a temperature of substantially 293 K is provided by forming a first layer of quantum dots covered by a spacer layer with strained areas extending there through. The spacer layer then forms a template upon which quantum dots of an active layer may be formed with a surface with a surface density and formation that is influenced by the underlying first layer of quantum dots. This allows a choice of growth parameters more favourable to the formation of quantum dots in the active layer emitting at long wavelengths with a narrow inhomogeneous broadening. As an example, the active layer of quantum dots may be formed at a lower temperature than the first layer of quantum dots. The quantum dots of the active layer are then subject to less intermixing with the surrounding spacer and capping layers, and can also preserve a more strain-relaxed state, which results in a longer wavelength emission with a narrower inhomogeneous broadening. This method is particularly well suited to the growth of the active region of an optoelectronic device on a GaAs substrate.

21 Claims, 6 Drawing Sheets

U.S. PATENT DOCUMENTS

| | | | |
|---|---|---|---|
| 6,177,684 B1 * | 1/2001 | Sugiyama | 257/17 |
| 6,507,042 B1 * | 1/2003 | Mukai et al. | 257/14 |
| 6,816,525 B1 * | 11/2004 | Stintz et al. | 372/45.01 |
| 6,992,320 B1 * | 1/2006 | Ebe et al. | 257/21 |
| 2001/0023942 A1 * | 9/2001 | Kim et al. | 257/14 |
| 2001/0028055 A1 * | 10/2001 | Fafard et al. | 257/17 |
| 2002/0075924 A1 * | 6/2002 | Mukai | 372/45 |
| 2002/0079485 A1 * | 6/2002 | Stintz et al. | 257/14 |
| 2002/0119680 A1 * | 8/2002 | Wang et al. | 438/962 |
| 2003/0059971 A1 * | 3/2003 | Chua et al. | 438/46 |
| 2005/0104083 A1 * | 5/2005 | Bader et al. | 257/103 |

FOREIGN PATENT DOCUMENTS

| | | |
|---|---|---|
| GB | 2373371 A | 9/2002 |
| JP | 09-326506 | 12/1997 |
| JP | 2000-196193 | 7/2000 |

* cited by examiner (a)  } Substrate And buffer layer (b)  } First layer (c)  } Spacer layer Strained areas (d)  } Active layer (e)  } Capping layer

METHOD OF FORMING QUANTUM DOTS FOR EXTENDED WAVELENGTH OPERATION

This application is the U.S. National Phase of International Application PCT/GB03/02152, filed on May 19, 2003, which designated the U.S. and claims priority to GB Application No. GB 0212055.8, filed May 24, 2002. The entire contents of these applications are incorporated herein by reference.

This invention relates to the field of optoelectronic devices. More particularly, this invention relates to the field of optoelectronic devices incorporating semiconductor quantum dots whose ground state emission occurs at wavelengths greater than 1350 nm at a temperature of substantially 293 K.

Semiconductor materials are used in many optoelectronic devices. The semiconductor structure is normally arranged in order that the device is optically active at a wavelength desired for that particular device. In many applications, particularly in telecommunications, there is a requirement to use wavelengths between 1250 and 1650 nm. These wavelengths are well suited to fibre optic transmission and to other fibre optic devices.

It is known to manufacture optoelectronic devices for use at these wavelengths based upon Indium Phosphide (InP) substrates. It would be desirable to be able to fabricate devices operable at these wavelengths using Gallium Arsenide (GaAs) substrates rather than InP substrates.

The main advantages of GaAs substrates are that they are widely available and less expensive than InP substrates. GaAs substrates are already widely used for devices operating at shorter wavelengths (below 1200 nm) and the methods of fabricating, processing and packaging such devices are well developed and could be adapted to devices operating at a longer wavelength.

The performances of GaAs-based devices are in some respects superior to those based upon InP, especially in terms of temperature sensitivity. Complex structures, such as Vertical Cavity Surface Emitting Lasers, can be often readily fabricated on GaAs systems in a single growth step, compared with the complicated processes, such as wafer bonding, that would be required for InP systems to achieve the same structures. Furthermore, GaAs electronics is well developed and GaAs-based optoelectronic devices integrating monolithically on the same chip both the optical functions and the electronic circuitry required to control them may be relatively readily provided.

It will be appreciated from the above that if GaAs systems could be made to operate at longer wavelengths, then this would be highly desirable.

There are three known technologies which have been shown to achieve longer wavelength operation on GaAs substrate: (see for example V. M. Ustinov and A. E. Zhukov, "GaAs-based long-wavelength lasers", Semicond. Sci. Technol. 2000, 15, R41). They are InAs or InGaAs quantum dots, GaInNAs quantum wells or dots, and GaAsSb quantum wells.

In the case of GaInNAs and GaAsSb quantum wells, the addition of Nitrogen or Antimony in the structure reduces the band gap and leads to longer wavelength emission. However, with the current growth techniques, the quality of the material is degraded when incorporating Nitrogen or Antimony.

Moreover, quantum dots present several advantages over the two competing techniques (based on quantum wells). These advantages are due to the three dimensional confinement of carriers (as opposed to one-dimensional for quantum wells) and to the inhomogeneously broadened emission (as opposed to homogeneously broadened emission for quantum wells). Such advantages are lower threshold current for lasers, lower temperature sensitivity, or the possibility of operating on a broader band of wavelengths.

Another important feature is that quantum dots can usually operate not only in their fundamental transition, but also in a wide band of wavelengths (corresponding to the excited states) shorter than their fundamental transition. For example, producing quantum dots emitting at 1480 nm from their ground state is not only important for applications at this wavelength, but can also be used at shorter wavelengths such as 1300 nm (from their second excited state, for example). Some benefits are then gained compared to quantum dots emitting directly light at 1300 nm from their ground state, due to an increased degeneracy of the excited states.

InAs or InGaAs quantum dots are usually fabricated according to the Stranski-Krastanov growth mode, whereby the strain resulting from a lattice mismatch between the substrate (GaAs) and the dot material (InAs or InGaAs) leads to the self-formation of three-dimensional islands. The growth is usually achieved using two main techniques: Molecular Beam Epitaxy (MBE) or Metal Organic Chemical Vapour Deposition (MOCVD). Under conventional growth conditions (i.e. similar to what is used for InGaAs quantum wells), the lateral dot dimensions are typically between 14 and 30 nm (see for example U.S. Pat. No. 5,614,435) and they typically emit at wavelengths shorter than 1200 nm at 300K. In the cases presented here for longer wavelength emission, the lateral dot dimensions are typically larger.

To extend the wavelength of InAs/GaAs quantum dots further, different techniques have been developed: R. P. Mirin et al., "1.3 μm photoluminescence from InGaAs quantum dots on GaAs", Appl. Phys. Lett. 1995, 67, 3795 proposed using Alternate Layer Epitaxy. R. Murray et al., "1.3 μm room temperature emission from InAs/GaAs self-assembled quantum dots", Jpn. J. Appl. Phys. 1999, Part 1 38, 528 proposed using low InAs growth rates. However, the longest wavelengths achieved with these techniques are close to 1300 nm and at most 1340 nm.

An alternative method involving either capping the dots with InGaAs, or growing the dots on InGaAs, or both was developed. K. Nishi et al., "A narrow photoluminescence linewidth of 21 meV at 1.35 μm from strain-reduced InAs quantum dots covered by $In_{0.2}Ga_{0.8}As$ grown on GaAs substrates", Appl. Phys. Lett. 1999, 74, 1111 proposed capping the dots with InGaAs and achieved emission up to 1350 nm with MBE. A. Passaseo et al., "Wavelength control from 1.25 to 1.4 μm in $In_xGa_{1-x}As$ quantum dot structures grown by metal organic chemical vapor deposition", Appl. Phys. Lett. 2001, 78, 1382 used a similar technique to achieve emission up to 1390 nm with MOCVD. Finally, J. Tatebayashi et al., "Over 1.5 μm light emission from InAs quantum dots embedded in InGaAs strain-reducing layer grown by metalorganic chemical vapor deposition", Appl. Phys. Lett., 2001, 78, 3469 observed emission up to 1520 nm, but with a strongly reduced luminescence efficiency, which is therefore not suitable for use in an optoelectronic device.

Another important property of a quantum dot sample is the inhomogeneous broadening of the emission, measured by the Full Width at Half Maximum (FWHM) of the ground state photoluminescence peak at low excitation and low temperature (typically 10 K). For many applications such as lasers, the FWHM needs to be as small as possible for the best performances. The narrowest FWHM achieved for emission wavelengths above 1300 nm is 18 meV, in R. P. Mirin et al., "Narrow photoluminescence linewidths from ensembles of self-assembled InGaAs quantum dots", J. Vac. Sci. Technol. B 2000, 18, 1510.

One feature of the growth of quantum dots relevant to the present invention is the possibility to grow vertically aligned quantum dot structures simply by growing successive closely spaced quantum dot layers. This feature was recognized early (see for example Q. Xie et al., "Vertically self-organized InAs quantum box islands on GaAs (100)", Phys. Rev. Lett. 1995, 75, 2542) and has been much studied since. Mukhametzhanov et al., <<Independent manipulation of density and size of stress-driven self-assembled quantum dots>>, Appl. Phys. Lett. 1998, 73, 1841 used this feature to grow a second layer of larger dots with a lower density than would otherwise be possible with the growth conditions used. A first layer with a low density of small quantum dots was grown which determined the density of the second layer, due to the vertical stacking. The resulting quantum dots in the second layer, although grown at a conventional growth rate of 0.22 ML/s were then similar (in terms of density, dimensions and emission properties) to quantum dots directly grown at a low growth rate.

Viewed from one aspect the present invention provides an optoelectronic device including semiconductor quantum dots capable of at least one of emitting, absorbing or amplifying radiation in their ground state at wavelengths greater than 1350 nm at a temperature of substantially 293K, or in their excited states.

Viewed from another aspect the present invention provides a method of forming the active region of an optoelectronic device incorporating semiconductor quantum dots whose ground state emission occurs at wavelengths greater than 1350 nm at a temperature of substantially 293 K, said method comprising the steps of:

growing a first layer of quantum dots formed on one of a substrate layer or a buffer layer, said quantum dots of said first layer being subject to a strain due to a lattice mismatch between said substrate layer and said quantum dots of said first layer;

growing a spacer layer over said first layer and said spacer layer being subject to a strain in strained areas overlying quantum dots of said first layer due to a lattice mismatch between said quantum dots of said first layer and said spacer layer;

growing an active layer of quantum dots on said spacer layer, quantum dots of said active layer predominately forming upon strained areas of said spacer layer such that the surface density of quantum dots of said active layer is substantially determined by the surface density of quantum dots of said first layer, quantum dots of said active layer being in a strain-relaxed state in which said quantum dots of said active layer are subject to less strain than quantum dots grown on an unstrained surface, growth conditions for said active layer being different to those of the first layer and chosen appropriately, in particular substrate temperature being low enough, such as to substantially preserve said strain-relaxed state and to limit intermixing of said quantum dots of said active layer with said spacer layer; and growing a capping layer on said active layer, growth conditions for said capping layer chosen appropriately, in particular substrate temperature being low enough, such as to substantially preserve said strain-relaxed state and to limit intermixing of said quantum dots of said active layer with said spacer layer and with said capping layer.

The present invention relies in part on the possibility of growing a first layer to set the density of a second layer. Although this technique has been known for many years, the possibility to use the first layer to engineer the strain state of the second layer, and the importance of the intermixing effects during growth and capping of this second layer were not recognized. This is why this technique has not been used to extend the emission of the quantum dots to desirable wavelengths beyond 1350 nm at room temperature.

It will be understood that this technique is particularly well suited to embodiments where the substrate is a GaAs substrate.

Under suitable growth and capping conditions, the strain relaxation in the quantum dots of the active layer leads to a lower band gap and consequently a ground state emission at a longer wavelength. The capping conditions may be chosen such that the benefits obtained from the strain-relaxation (long wavelength emission) are not lost due to another competing mechanism. For example, strain-relaxed InGaAs quantum dots have a tendency to experience more gallium/indium intermixing during capping, which would result in a shorter wavelength emission. The substrate temperature therefore can be made low enough to avoid these intermixing effects. This is facilitated by the fact that the surface density of the quantum dots of the active layer is determined by that of the first layer, due to the strain interaction. The growth parameters of the active layer can therefore be adjusted without affecting its quantum dot density. This is different from a conventional quantum dot layer, where changing the growth parameters strongly affects the density, and where a reduced substrate temperature, for example, leads to a high density of small quantum dots emitting at a short wavelength.

Existing techniques which have been used to extend the emission wavelength of InAs quantum dots, such as the use of InGaAs barriers or the incorporation of Nitrogen, are usually associated with a degradation of material quality and consequently strong reductions in the intensity of emission at room temperature. These techniques may be advantageously avoided in some embodiments whilst maintaining a long wavelength and strong room temperature emission.

The strain interaction between layers and the reduced intermixing also produces quantum dots with a better uniformity. Much narrower FWHM in the photoluminescence emission of the active layer can therefore be achieved.

It will be appreciated that the thickness of the spacer layer could vary depending upon the particular circumstances and substances being used, but this spacer layer has been found to advantageously have a thickness of $3 \times 10^{-9}$ m to $3 \times 10^{-8}$ m.

In the preferred embodiments, it is advantageous that the quantum dots of the first layer are grown such as their strain field is strong enough to extend substantially through the spacer layer. This is facilitated by growing the first quantum dot layer at a low growth rate of less than 0.06 monolayer per second. For convenience, this growth rate may also be kept unchanged for the second quantum dot layer.

It will be appreciated that, depending on the spacer layer thickness, the quantum dots of the active layer may be electronically coupled to those of the first layer, which can represent an advantage for some applications.

Whilst it will be appreciated that depending upon the particular device and application, the surface density of the quantum dots could vary considerably, the invention is particularly well suited to embodiments in which the surface density of the quantum dots is between $10^{13}$ and $10^{15}$ per square meter.

It will be understood that for some devices, and in particular circumstances, it may be desirable to have more than one active layer of quantum dots and such can be achieved by forming further spacer layers (possibly provided by the capping layer) and active layers to produce a stack of active layers of quantum dots having the desirable properties.

Whilst the present techniques may be applied using a range of different material possibilities, in preferred embodiments the quantum dots are one of InAs quantum dots, InGaAs quantum dots or GaInNAs quantum dots. In a similar way at least part of the substrate layer could be formed of a variety of materials, but is preferably one of GaAs or AlGaAs. The spacer layer and the capping layer may also be at least partially formed of a variety of different complementary materials, such as GaAs, AlGaAs, in GaAs, InAlGaAs or GaInNAs. In particular, it can be advantageous to form the last part of the spacer layer or the first part of the capping layer or both with InGaAs instead of GaAs.

The optoelectronic devices formed using the above described techniques could have a wide variety of different functions and forms depending upon the particular application, but the present invention is particularly useful when the active layer is operable to perform at least one of radiation emitting, radiation amplifying, radiation detecting and radiation absorbing.

A first feature of the active region according to the current technique and associated with its improved performances is that the density of dots in the active layer is determined by the density of dots of the first layer. This enables choice of the density of the dots in the active layer independently of the growth parameters used to grow and cap it.

A second feature of this technique is that the first feature is used to choose the growth parameters of the active layer such that the strain-relaxed state of the dots of the active layer is preserved and that the intermixing effects are reduced as much as possible. These are two significant factors in achieving a longer wavelength emission with a narrow broadening.

A particularly preferred advantageous feature of this method of forming an optoelectronic device is that the active layer is grown at a lower temperature than the first layer. This is facilitated by the template/keying action of the strained areas of the spacer layer in providing sites for the quantum dots of the active layer to form at temperatures lower than would otherwise be required to form such quantum dots in the absence of the spacer layer. The formation of the quantum dots of the active layer at a lower than otherwise temperature tends to improve their uniformity and performance characteristics, e.g. emission at a longer wavelength with a narrower FWHM.

The action of the spacer layer in providing a template/key for formation of quantum dots in the active layer is improved when the spacer layer is subject to annealing prior to the formation of the quantum dots of the active layer.

Embodiments of the invention will now be described, by way of example only, with reference to the accompanying drawings in which:

FIG. 1 schematically illustrates the formation of the active region of an optoelectronic device;

FIG. 2 schematically illustrates the layer structure of the active region of an optoelectronic device having five active layers of quantum dots;

FIG. 3 schematically illustrates the layer structure of the active region of an optoelectronic device having three active layers of quantum dots;

Figure 6:
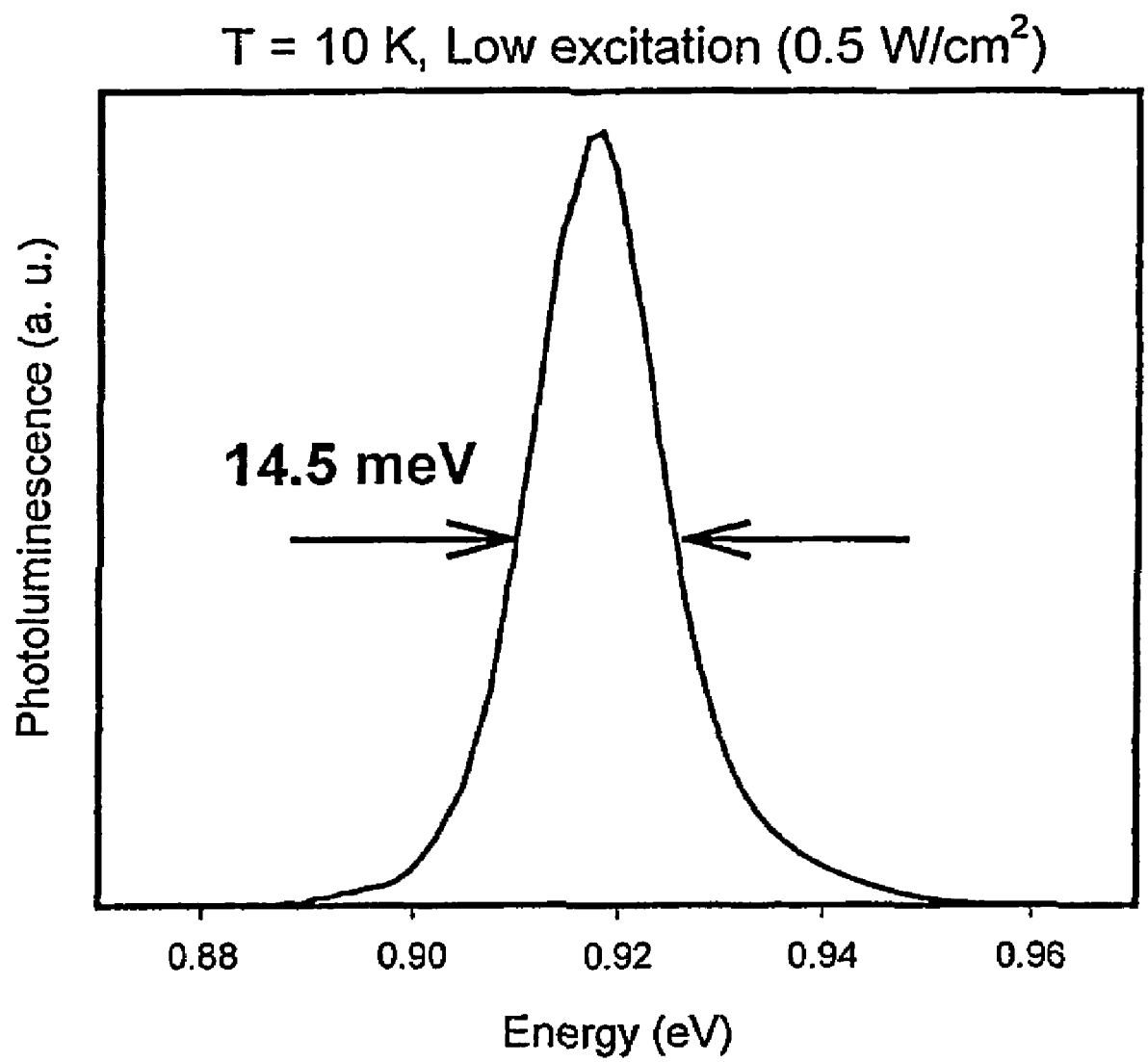
Figure 7:
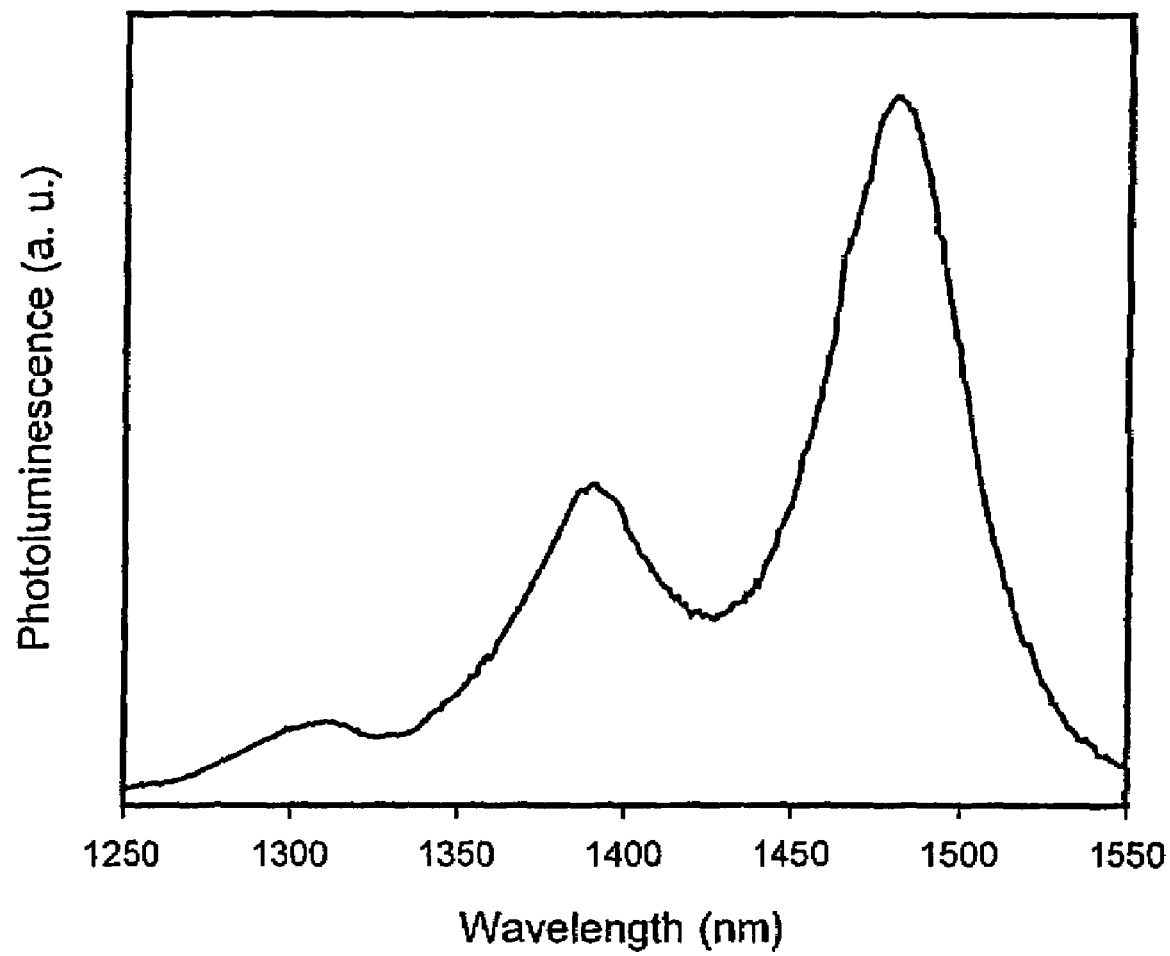

FIG. 6 illustrates the low temperature, low excitation photoluminescence spectrum of another active region of an optoelectronic device where the last part of the spacer layer and the first part of the capping layer are composed of InGaAs; and FIG. 7 illustrates the room temperature, high excitation photoluminescence spectrum of the same active region of an optoelectronic device as that shown in FIG. 6.

There is described a method of producing high quality quantum dot layers, emitting at longer wavelengths (above 1350 nm) from their ground state, with a good luminescence efficiency and a narrow FWHM. Such a structure can be used as the active region of many optoelectronic devices grown on GaAs substrates and operating at wavelengths above 1350 nm. Such an active region could also provide significant improvements to optoelectronic devices operating at shorter wavelengths, by using emission and absorption in the excited states of the dots.

Figure 1:
Figure 1:
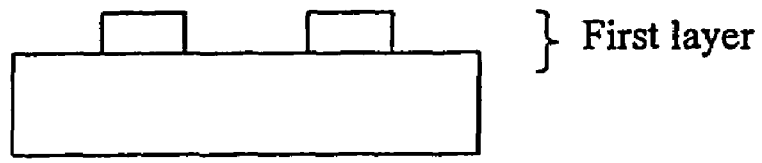
Figure 1:
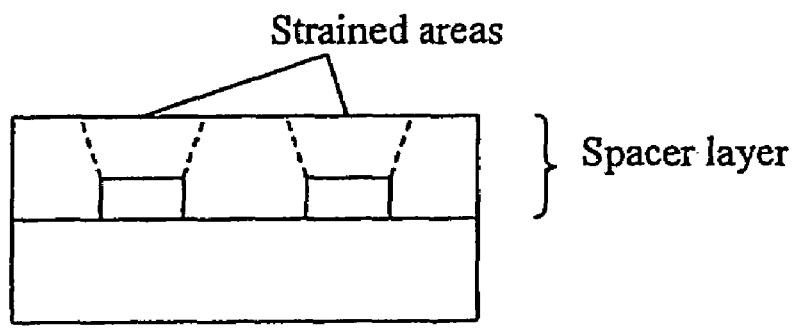
Figure 1:
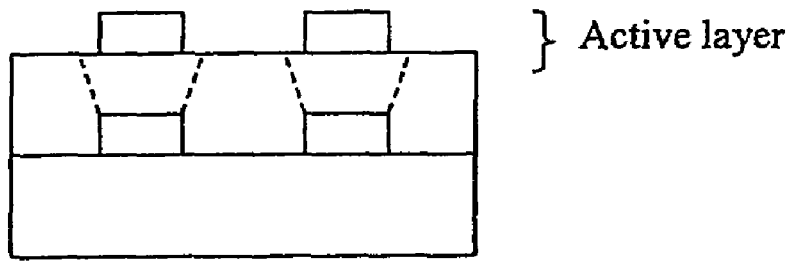
Figure 1:
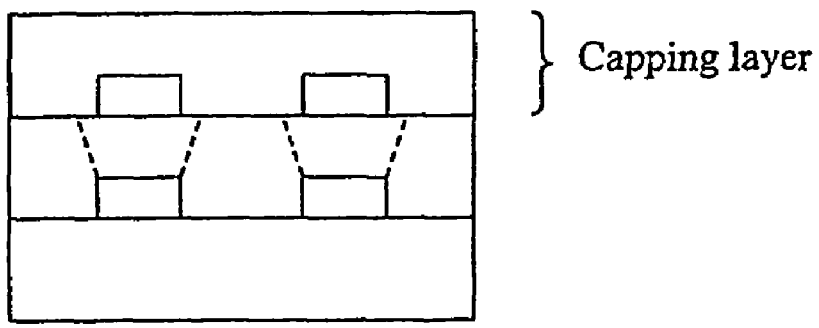

FIG. 1 schematically illustrates the formation of the active region of an optoelectronic device. At step (a) a substrate, such as a GaAs substrate, is provided, typically in the form of a wafer. A buffer layer, such as GaAs, can be grown on this substrate.

At step (b), a first layer of quantum dots, such as InAs quantum dots, is formed according to the Stranski-Krastanov growth mode whereby the strain resulting from the lattice mismatch between the substrate and the quantum dots results in the self-formation of three-dimensional islands which constitute the quantum dots.

At step (c), a spacer layer, such as a GaAs spacer layer, is deposited on top of the first layer. The lattice constant mismatch between the quantum dots of the first layer and the spacer layer results in a strain field between the spacer layer and the quantum dots which extends up through to the top surface of the spacer layer to produce strained areas on the top surface of the spacer layer corresponding to the underlying quantum dots of the first layer.

At step (d), an active layer of quantum dots, such as InAs quantum dots, is deposited on top of the spacer layer. The strained areas on the top surface of the spacer layer form a template for the formation of the quantum dots of the active layer which are aligned to overlie the quantum dots of the first layer. The presence of this strain field usually manifests itself by a reduction in the InAs coverage required for the growth to change from 2D to 3D, as can be measured using Reflection High Energy Electron Diffraction (RHEED). The surface density of the quantum dots of the active layer is effectively controlled by the template provided by the strained areas on the top surface of the spacer layer rather than by the particular growth parameters used for the formation of the active layer. Accordingly, the active layer of quantum dots can be formed with different growth parameters than would otherwise be required to form that active layer of quantum dots in the absence of the underlying first layer and spacer layer. This at least partial decoupling of the growth parameters for the quantum dots of the active layer from the quantum dot surface density of the active layer allows growth parameters to be used which are more favourable to achieving long wavelength emission characteristics of the active layer of quantum dots than would otherwise be possible. As an example, the active layer of quantum dots may be grown at a lower temperature resulting in less intermixing of the material of the quantum dots with the underlying spacer layer. The higher uniformity of the active layer of quantum dots this formed results in a narrower inhomogeneous broadening. Furthermore, since the spacer layer is strained by the underlying first layer, it has a lattice constant in the strained areas that more closely matches the quantum dots of the active layer and accordingly the quantum dots of the active layer are more strain-relaxed than quantum dots forming on an unstrained surface. This, together with the reduced intermixing, contributes to the desirable long wavelength emission.

At step (e), a capping layer, such as GaAs, is formed over the active layer of quantum dots. The capping layer, and especially its first few nanometers, is usually, but not necessarily, grown under the same growth conditions as the active layer to avoid a growth interruption.

It will be appreciated that the simple example shown in FIG. 1 uses one material system, namely GaAs and InAs, but that other possibilities are available, such as forming the capping layers and/or spacer layers, or part of them, of InGaAs instead of GaAs. As further alternatives, material systems such AlGaAs with AlGaAs spacers may be used in place of the GaAs and InGaAs layers discussed above. GaInNAs may also be used as the material of the quantum dots or spacer/capping layers.

Figure 2:
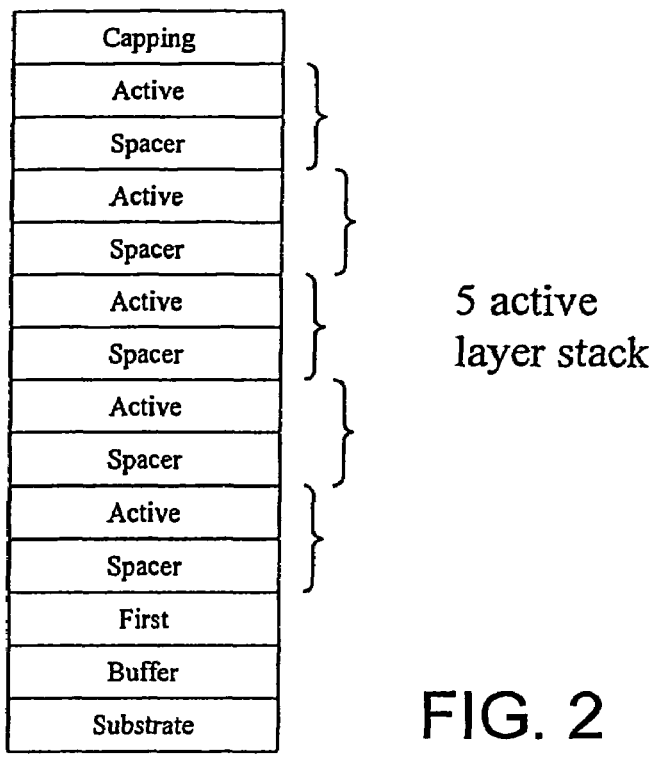

The FIG. 1 embodiment shows the formation of a single active layer. FIG. 2 illustrates the active region of an optoelectronic device in which further active layers are formed by repeatedly depositing a spacer layer and an active layer. In the FIG. 2 example, once the initial first layer of quantum dots has been formed, five groups of associated capping/spacer layers and active layers are deposited thereupon followed by a final capping layer.

Figure 3:
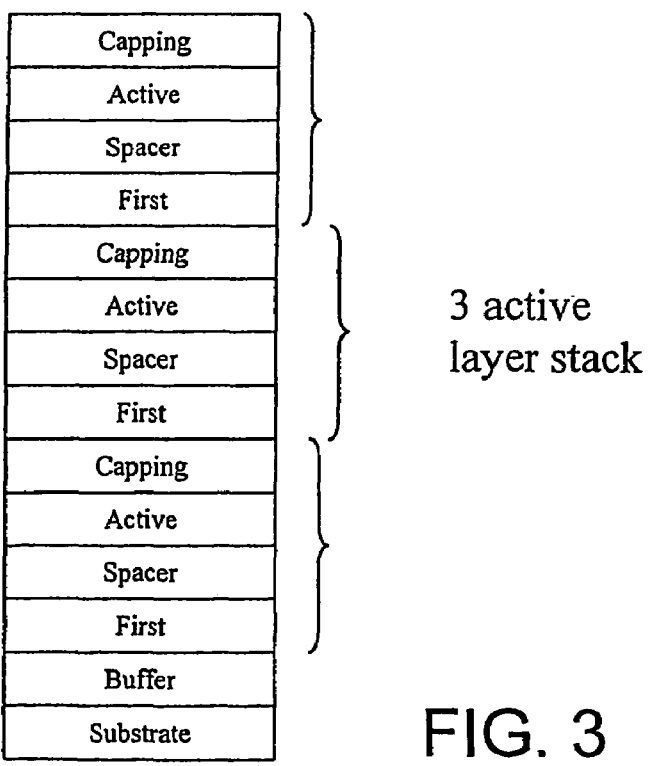

FIG. 3 illustrates and alternative embodiment of the active region of an optoelectronic device. In this embodiment three active layers are formed. The device is formed of three groups of layers, each group of layers comprising a first layer, a spacer layer, an active layer and a capping layer. After the first capping layer has been deposited, another first layer is deposited thereupon and the sequence repeated.

A distinction between a capping layer and a spacer layer in the FIG. 3 embodiment relates to the thickness of the capping layer relative to the thickness of a spacer layer. A capping layer will generally be much thicker, so that the strained areas do not extend up through it.

Figure 4:
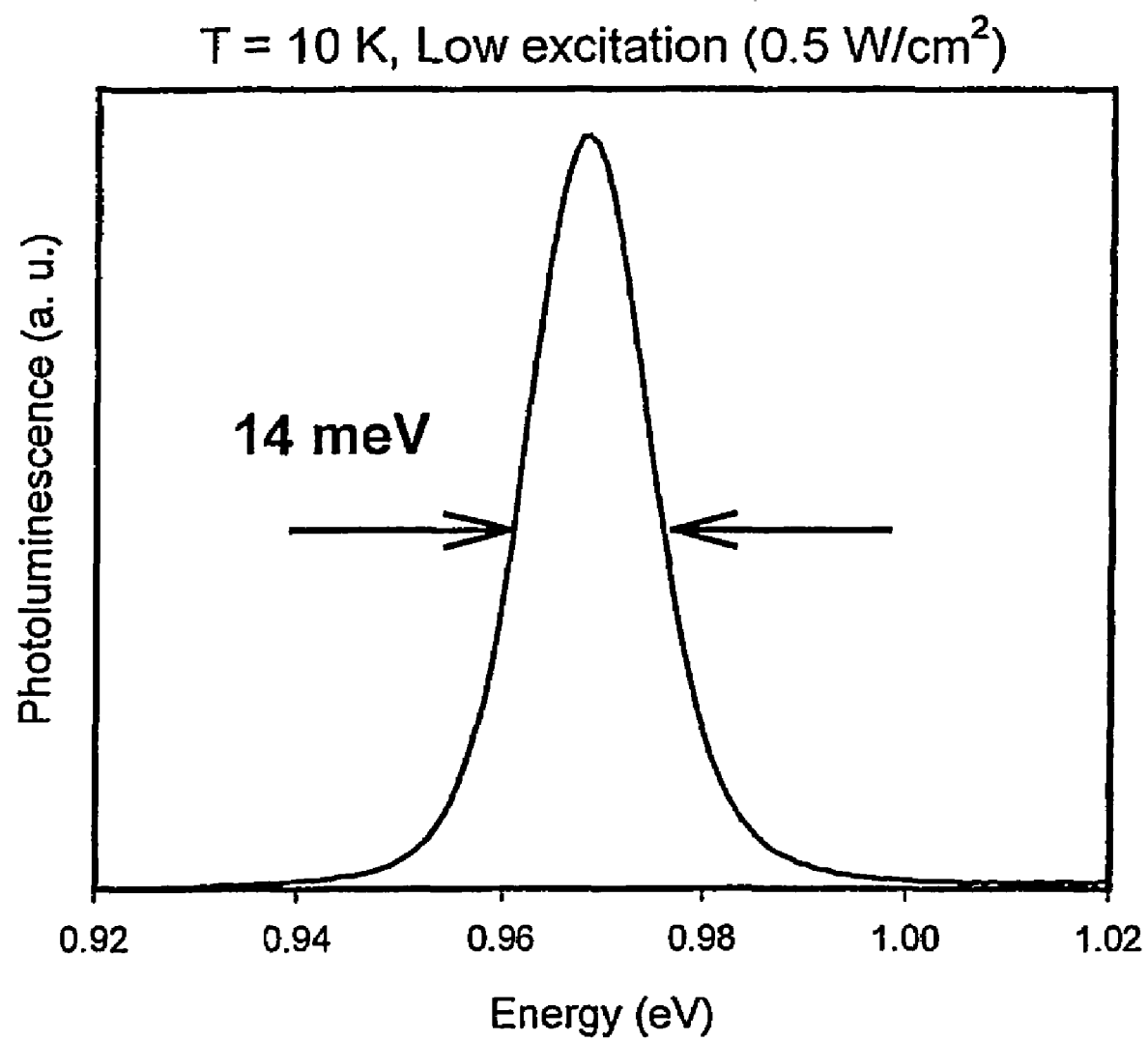
FIG. 4 illustrates the low temperature, low excitation photoluminescence spectrum of the active region of an optoelectronic device where the spacer and capping layers are composed of GaAs only.

FIG. 4 illustrates the low temperature (10K), low excitation photoluminescence spectrum of the active region of an optoelectronic device formed in accordance with the above techniques. In this first example, the spacer layer and the capping layer are formed of GaAs only. As will be seen, the emission peaks at a relatively high 1280 nm with a narrow full width and a half maximum of 14 meV indicating the high uniformity of the quantum dots that have been formed.

Figure 5:
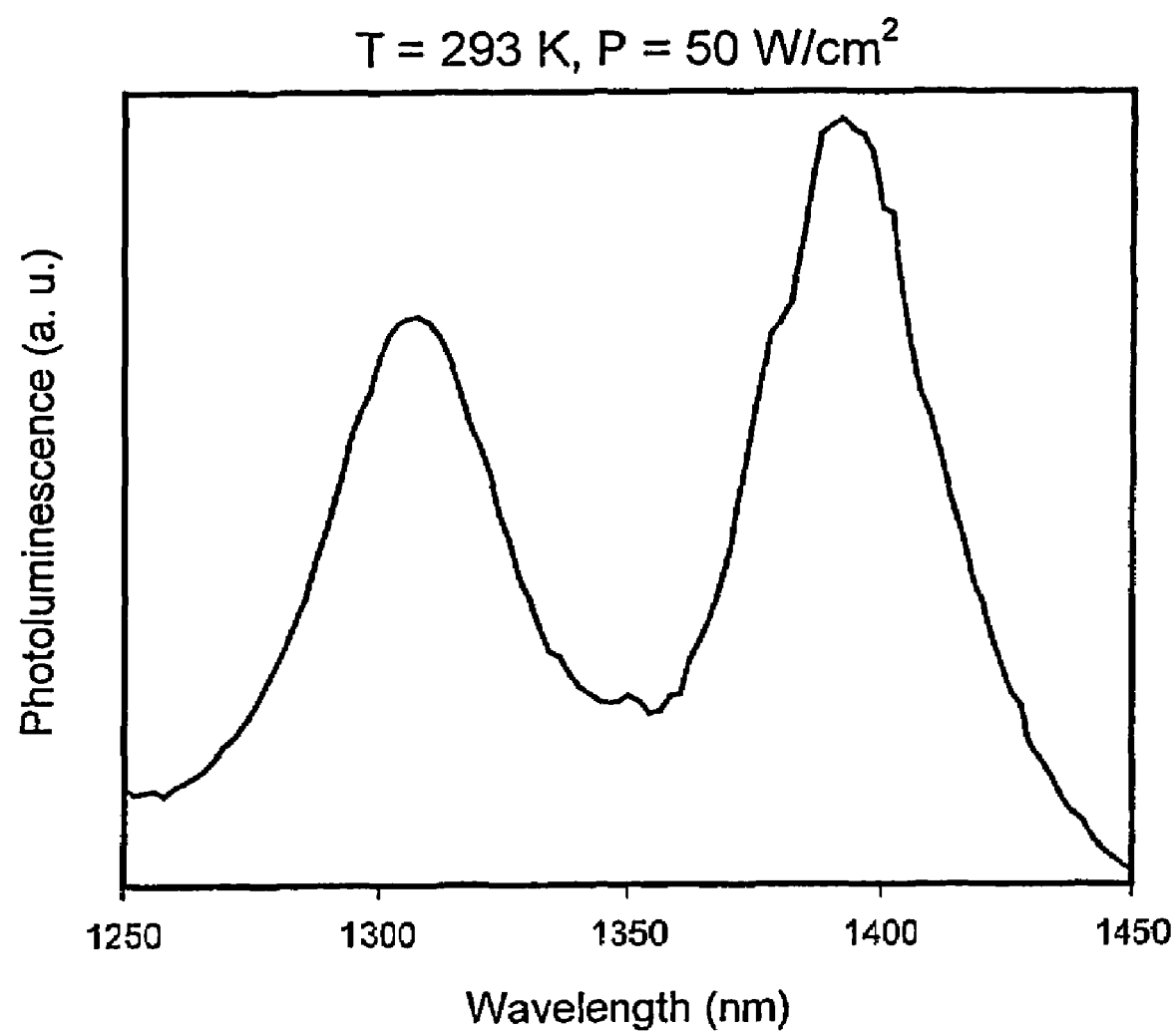
FIG. 5 illustrates the room temperature, high excitation photoluminescence spectrum of the same active region of an optoelectronic device as that shown in FIG. 4.

FIG. 5 illustrates the room temperature, high excitation spectrum for the same device. In this case, it will be seen that the emission peaks have moved up in wavelength for this room temperature operational regime of the device to approximately 1390 nm for the ground state emission, which even extends up to 1430 nm. This makes possible the fabrication of GaAs based devices operating at wavelengths beyond 1350 nm. Moreover, the first excited state emission is observed around 1300 nm. Such an active region could therefore improve the performance of GaAs based quantum dot devices operating near 1300 nm, since the maximum optical gain obtainable from the first excited state is twice as large as that obtainable from the ground state.

Another example of a quantum dot sample illustrating the benefits of this technique is now given. The difference with the previous example is that InGaAs was used to cap the dots instead of GaAs. The resulting emission wavelength is even longer and observed at 1480 nm at room temperature.

FIG. 6 illustrates the low temperature (10K), low excitation photoluminescence spectrum of this other active region formed in accordance with the above techniques. The difference with the previous example is that InGaAs was used in the last part of the spacer layer and in the first part of the capping layer, instead of GaAs. As will be seen, the emission peaks at an even higher wavelength of 1350 nm (at 10K) with a narrow FWHM of 14.5 meV.

FIG. 7 illustrates the room temperature, high excitation spectrum for the same active region. In this case, it will be seen that room temperature emission from the ground state peaks at 1480 nm, and extends beyond 1500 nm. This again makes possible the fabrication of GaAs-based devices operating at these long wavelengths. Also, first excited state emission is obtained at 1390 nm and second excited state emission around 1300 nm. Such an active region could therefore improve the performance of GaAs based quantum dot devices operating at these wavelengths, since the maximum optical gain obtainable from the second excited state is four times that of the ground state, and that of the first excited state is twice as large as that from the ground state.

A more specific example of the parameters used to form the example optoelectronic device for which the low temperature and room temperature spectra are illustrated in FIGS. 4 and 5 is given below.

A 2 inch n+ doped GaAs wafer is loaded in a molecular beam epitaxy (MBE) system and pumped down to an ultra high vacuum. The substrate temperature is taken to 620° C. for oxide removal. After growth of a 100 nm GaAs buffer layer at 580° C., the temperature is dropped to 500° C. for growth of the first quantum dot layer. The absolute values of the substrate temperatures are difficult to evaluate in an MBE system. In our case, the reference temperature is the temperature for which the GaAs surface reconstruction changes from a 2×4 pattern to a c4×4 pattern, this pattern being monitored with Reflection High Energy Electron Diffraction (RHEED). For the Arsenic background pressure used here ($2.6 \times 10^{-6}$ mbar), this reference temperature was measured to be 500° C. with a pyrometer. The other temperatures are measured relative to this reference using a thermocouple. The first quantum dot layer consists of deposition of 2.2 ML of InAs at a growth rate of 0.015 monolayer per second, and immediately capped with 12 nm of GaAs at 500° C. The temperature is then raised to 580° C., the sample annealed for 10 minutes, and the temperature dropped back to 470° C. for growth of the active quantum dot layer. This layer consists of deposition of 2.7 ML of InAs at 470° C., immediately capped with 10 nm of GaAs at 470° C. The temperature is then raised to 580° C. for the growth of the remainder of the GaAs cap (100 nm). See FIGS. 4 and 5 for low temperature and room temperature photoluminescence from such a sample.

For the second example (FIGS. 6 and 7), the only differences are that the spacer layer consists of 10 nm of GaAs followed by 2 nm of InGaAs with an indium composition of 15% and that the first 5 nm of the capping layer are replaced by 5 nm of InGaAs with an indium composition of 26%.

KEY TO FIGURES

FIG. 4

Low temperature, low excitation photoluminescence spectrum. The emission peaks at 0.968 eV (1280 nm) with a narrow full width at half maximum of 14 meV indicating the high uniformity of the quantum dots.

FIG. 5

Room temperature, high excitation spectrum. The ground state emission peaks at 1390 nm and extends up to around 1430 nm. First excited emission occurs around 1300 nm

FIG. 6

Low temperature, low excitation photoluminescence spectrum of the second example (containing InGaAs in the spacer and capping layers). The emission peaks at 0.918 eV (1350 nm) with a narrow full width at half maximum of 14.5 meV indicating the high uniformity of the quantum dots.

FIG. 7

Room temperature, high excitation photoluminescence spectrum of the second example (containing InGaAs in the spacer and capping layers). The ground state emission peaks at 1480 nm and extends beyond 1500 nm. First excited state emission occurs at 1390 nm and second excited state emission around 1300 nm.

The invention claimed is:

1. A method of forming the active region of an optoelectronic device incorporating semiconductor quantum dots whose ground state emission occurs at wavelengths greater than 1350 nm at substantially 293 K, said method comprising the steps of:
    growing a first layer of quantum dots formed on one of a substrate layer or a buffer layer, said quantum dots of said first layer being subject to a strain due to a lattice mismatch between said substrate layer and said quantum dots of said first layer;
    growing a spacer layer over said first layer and said spacer layer being subject to a strain in strained areas overlying quantum dots of said first layer due to a lattice mismatch between said quantum dots of said first layer and said spacer layer;
    growing an active layer of quantum dots on said spacer layer, quantum dots of said active layer predominately forming upon strained areas of said spacer layer such that the surface density of quantum dots of said active layer is substantially determined by the surface density of quantum dots of said first layer, quantum dots of said active layer being in a strain-relaxed state in which said quantum dots of said active layer are subject to less strain than quantum dots grown on an unstrained surface, growth conditions for said active layer being different to those of the first layer and chosen appropriately, in particular substrate temperature being low enough, such as to substantially preserve said strain-relaxed state and to limit intermixing of said quantum dots of said active layer with said spacer layer; and
    growing a capping layer on said active layer, growth conditions for said capping layer chosen appropriately, in particular substrate temperature being low enough, such as to substantially preserve said strain-relaxed state and to limit intermixing of said quantum dots of said active layer with said spacer layer and with said capping layer.

2. A method as claimed in claim 1, wherein said spacer layer is grown to a thickness of $3 \times 10^{-9}$ m to $3 \times 10^{-8}$ m.

3. A method as claimed in claim 1, wherein said first layer of quantum dots is grown at a growth rate of less than 0.06 monolayer per second.

4. A method as claimed in claim 1, wherein said quantum dots in said first layer are grown to have a surface density of between $10^{13}$ and $10^{15}$ per square meter.

5. A method as claimed in claims 1, wherein said capping layer acts as a spacer layer for growth of one or more further active layers and capping layers.

6. A method as claimed in claim 1, comprising growing one or more further first layer, spacer layer, active layer and capping layer groups on said capping layer.

7. A method as claimed in claim 1, wherein said quantum dots are one of:
    (i) InAs quantum dots;
    (ii) InGaAs quantum dots; and
    (iii) GaInNAs quantum dots.

8. A method as claimed in claim 1, wherein at least part of said substrate layer or said buffer layer is one of:
    (i) GaAs;
    (ii) AlGaAs.

9. A method as claimed in claim 1, wherein at least part of said spacer layer is one of:
    (i) GaAs;
    (ii) AlGaAs;
    (iii) InGaAs;
    (iv) InAlGaAs; and
    (v) GaInNAs.

10. A method as claimed in claim 1, wherein at least part of said capping layer is one of:
    (i) GaAs;
    (ii) AlGaAs;
    (iii) InGaAs;
    (iv) InAlGaAs; and
    (v) GaInNAs.

11. A method as claimed in claim 1, wherein said active layer is operable to perform at least one of:
    (i) radiation emitting;
    (ii) radiation amplifying;
    (iii) radiation detecting; and
    (iv) radiation absorbing.

12. A method as claimed in claim 1, wherein the mean size of quantum dots in said active layer is different to the mean size of quantum dots in said first layer.

13. A method as claimed in claim 1, wherein said active layer is grown at a lower temperature than said first layer.

14. A method as claimed in claim 1, wherein said capping layer is grown at a lower temperature than said first layer.

15. A method as claimed in claim 1, wherein said spacer layer is annealed prior to growing said active layer on said spacer layer.

16. A method as claimed in claim 1, wherein growth is interrupted between said spacer layer and said active layer in order to change the growth parameters.

17. A method as claimed in claim 1, wherein growth is interrupted between said active layer and said capping layer in order to change the growth parameters.

18. A method as claimed in claim 1, wherein the quantum dots of said first layer are electronically coupled to the quantum dots of said active layer.

19. A method as claimed in claim 1, wherein said quantum dots of said active layer are operable to at least one of emit, absorb or amplify light in their ground states.

20. A method as claimed in any claim 1, wherein said quantum dots of said active layer are operable to at least one of emit, absorb or amplify light in their excited states.

21. An optoelectronic device containing an active region grown according to the method described in claim 1.

* * * * *